United States Patent
Kusbel

(10) Patent No.: US 7,139,530 B2
(45) Date of Patent: Nov. 21, 2006

(54) METHOD AND APPARATUS FOR CALIBRATING A REFERENCE OSCILLATOR

(75) Inventor: Patrick J. Kusbel, San Diego, CA (US)

(73) Assignee: Kyocera Wireless Corp., San Diego, CA (US)

(*) Notice: Subject to any disclaimer, the term of this patent is extended or adjusted under 35 U.S.C. 154(b) by 460 days.

(21) Appl. No.: 10/314,432

(22) Filed: Dec. 6, 2002

(65) Prior Publication Data

US 2003/0199254 A1 Oct. 23, 2003

Related U.S. Application Data

(60) Provisional application No. 60/339,019, filed on Dec. 7, 2001.

(51) Int. Cl.
*H04B 17/00* (2006.01)
*H04B 1/06* (2006.01)
*H03C 1/62* (2006.01)

(52) U.S. Cl. ............................. 455/67.11; 455/115.1; 455/259

(58) Field of Classification Search ............ 455/196.1, 455/131, 182.1, 192.1, 313, 317, 60, 255, 455/256, 257, 258, 77, 63.1, 259, 264, 69, 455/310, 265, 180.3, 67.11, 423, 67.12, 425, 455/67.14, 115.1, 115.2, 226.1; 331/47, 331/2, 49; 709/223; 370/510, 509, 503, 370/142, 145, 149
See application file for complete search history.

(56) References Cited

U.S. PATENT DOCUMENTS

| | | | | |
|---|---|---|---|---|
| 4,353,015 A * | 10/1982 | Krampe et al. | ............... | 318/41 |
| 4,504,976 A * | 3/1985 | Beaudet | ...................... | 398/197 |
| 4,546,328 A * | 10/1985 | Smith et al. | ................... | 331/4 |
| 5,151,703 A * | 9/1992 | Roos | ........................... | 342/199 |
| 5,262,957 A * | 11/1993 | Hearn | .......................... | 702/76 |
| 5,537,145 A * | 7/1996 | Miseli | ........................ | 348/181 |
| 5,740,525 A * | 4/1998 | Spears | ........................ | 455/259 |
| 5,818,305 A * | 10/1998 | Jeon | ............................ | 331/47 |
| 6,427,068 B1 * | 7/2002 | Suominen | ................... | 455/302 |
| 6,463,266 B1 * | 10/2002 | Shohara | .................... | 455/196.1 |
| 6,628,923 B1 * | 9/2003 | Eriksson | ..................... | 455/63.1 |
| 2002/0013835 A1 * | 1/2002 | Umezu et al. | .............. | 709/223 |
| 2002/0122662 A1 * | 9/2002 | Hsieh | .......................... | 388/800 |
| 2002/0173284 A1 * | 11/2002 | Forrester | ..................... | 455/255 |

* cited by examiner

*Primary Examiner*—Quochien B. Vuong
*Assistant Examiner*—Dominic E. Rego

(57) ABSTRACT

A method and apparatus for calibrating a reference oscillator and use of a calibrated reference oscillator is disclosed. To gain cost reduction advantages, a less accurate reference oscillator is utilized in a wireless communication device. The cost benefit is gained at the expense of reference oscillator accuracy in that its inability to generate a signal with a highly accurate reference frequency inhibits acquisition of a carrier or pilot signal. To compensate, a correction factor is generated by minimizing the difference between the reference oscillator signal and a signal of known frequency, such as an external reference signal. Access to the reference oscillator signal, or a signal related thereto, may be gained via the communication device antenna or a test port. The correction factor may be stored in the wireless communication device for use in conjunction with the reference oscillator to thereby generate the highly accurate reference signal at the reference frequency.

15 Claims, 3 Drawing Sheets

METHOD AND APPARATUS FOR CALIBRATING A REFERENCE OSCILLATOR

RELATED APPLICATION

This application claims priority to U.S. Provisional Application 60/339,019, filed on Dec. 7, 2001.

FIELD OF THE INVENTION

The field of the invention is communication electronics, and in particular, the present invention relates to frequency tuning for wireless communication.

RELATED ART

Demands placed on wireless communication devices are continually increasing. While consumer expectations require that the wireless communication device include more functions and a longer battery life, consumers are simultaneously demanding that devices also cost less, are lighter, and have talk times of greater duration than previous devices. As devices are developed which meet these needs, more users are utilizing wireless communication services.

Because each active communication device consumes a portion of a frequency band assigned to a communication system, it is important to efficiently utilize the available bandwidth. Moreover, it is desirable for each frequency band to accommodate as many wireless users as possible. Regardless of the particular method or standard utilized to achieve wireless communication, it is important that each wireless communication device accurately discriminate between the various frequencies, i.e. channels, upon which a base station transmits.

In many communication devices, an internal oscillator, known as a local oscillator (LO), is used to tune the internal systems of the communication device to a particular channel upon which communication is occurring. To tune to the exact carrier frequency for a particular channel, the local oscillator often utilizes a highly accurate reference frequency. In many systems, the local oscillator utilizes a highly accurate reference frequency generated by a precision reference oscillator to ensure that the local oscillator is oscillating at the correct frequency. Accordingly, known wireless communication devices use very expensive high-precision reference oscillators and associated precision circuitry to obtain the necessary accuracy and repeatability. The precision circuitry in the wireless communication device or mobile handset generally includes a voltage-controlled temperature-compensated crystal oscillator (hereinafter VC-TCXO). The VC-TCXO provides an accurate reference frequency, which is used by the handset to generate the various local oscillator frequencies which are, in turn, locked or tuned to the base station carrier frequency. In addition, depending upon the handset's current temperature, the VC-TCXO adjusts its tuning to maintain a constant reference frequency output.

Such VC-TCXOs are, however, relatively expensive, adding significantly to the cost of a handset. Moreover, despite a VC-TCXO's expense, its frequency output eventually drifts with age. In addition, VC-TCXOs typically have an indeterminate initial offset resulting from manufacturing tolerance that causes their actual frequency to be somewhat different from the desired frequency. This greatly complicates a handset's design.

One proposal to overcome the drawbacks of the prior art is to utilize low-cost reference oscillators. Unfortunately, the low-cost reference oscillators are prone to substantial initial error and a large individual variation between components. Further, these less expensive reference oscillators degrade in accuracy performance over time. As a result, less expensive oscillators have heretofore not been effectively utilized to generate an accurate frequency reference.

There is thus a need in the art for a method and apparatus to generate, in a cost effective manner, a reference signal for use in a wireless communication device.

SUMMARY

To overcome the drawbacks of the prior art, the method and apparatus allows use of a less costly reference oscillator, also referred to as a local oscillator. The benefit of a less costly reference oscillator is achieved at the expense of less accuracy in the frequency of the signal generated by the reference oscillator. As described above, failure to generate an accurate reference signal may prevent acquisition of the carrier or pilot signal by the communication device. In one particular use, the wireless device is a mobile telephone handset configured to communicate with one or more base stations. In other embodiments the communication device may comprise a pager, PDA, GPS unit, text messaging device, or any other wireless device.

To overcome these challenges, the method and apparatus described herein utilizes an efficient and inexpensive calibration technique to determine the amount of error between the actual frequency of the signal generated by the reference oscillator and the desired frequency, which may be referred to as the reference frequency or the desired frequency. The error may be represented as a frequency or as a voltage or other numeric value that may be equated to a voltage that represents the error or an error correction factor. The calibration technique described herein generates a correction factor or offset value that is related to the difference between the actual frequency generated by the reference oscillator and the desired reference frequency.

While there exist numerous way to generate the correction factor, in one embodiment, the communication device is activated and the reference oscillator begins to generate a signal that may have a frequency that is different than the desired reference frequency. This signal may be exported from the communication device via an antenna, test port, or other means for analysis by test equipment and/or a spectrum analyzer. In one embodiment, the analysis comprises determining the difference between the frequency of the signal generated within the communication device and the desired frequency. This difference signal, which may be represented as a voltage or numeric value, is utilized to generate the correction factor. Thereafter, the correction factor is stored in memory or is otherwise available to the communication device. As an advantage of the method and apparatus described herein, a unique correction factor is generated for use with each oscillator. Consequently, individual variations between oscillators are accounted for and uniformity between each oscillator operation is not as important as in the prior art. This may increase the yield of acceptable oscillators, since those that do not meet the specified reference frequency requirements may now be utilized. As a result, further price reductions in oscillators may occur.

During operation of the communication device, the reference oscillator is activated to generate a reference signal at a desired reference frequency. The actual frequency of the signal generated by the reference oscillator may be different than the desired reference frequency. As a result, the reference signal generation system retrieves the correction factor from memory and utilizes the offset provided thereby to compensate the reference signal. The compensation, either prior to generation or after generation of the reference signal, modifies the frequency of the reference signal so that the reference signal is at the reference frequency. As a result, the communication device may utilize a low cost oscillator in cooperation with the compensation method described herein to generate a highly accurate reference signal at the reference frequency.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

For a more complete understanding of the present invention and the advantages thereof, reference is now made to the following descriptions taken in conjunction with the accompanying drawings, tables and attachments.

DETAILED DESCRIPTION

Figure 1:
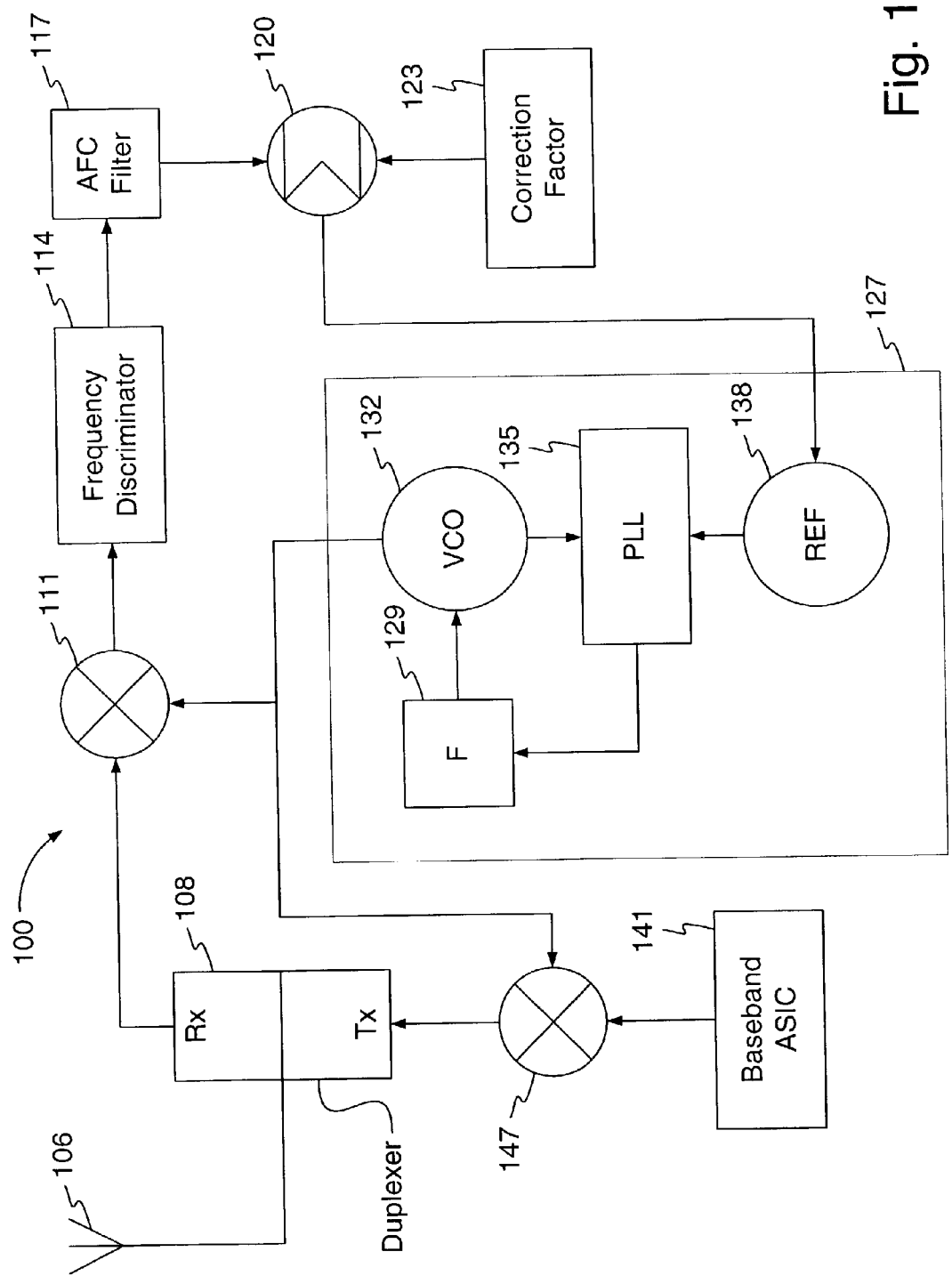
FIG. 1 illustrates a block diagram of a temperature compensated crystal oscillator loop.

In reference to FIG. 1, a temperature compensated crystal oscillator (TCXO) loop 100 is shown. An antenna 106 connects to a duplexer 108 configured to receive outgoing signals to a transmit side mixer 147. The transmit side mixer 147 upconverts the outgoing signal received from a base band ASIC 141, other processor, or signal source to a carrier frequency for transmission over the antenna 106.

The duplexer 108 routes signals received via the antenna 106 to a receiver side mixer 111, which in turn downconverts the RF signal to either IF or directly to baseband (commonly known as zero-IF). The output of the receiver side mixer 111 may comprise a base band signal, which is provided to a frequency discriminator 114 and other downstream processing. The transmit side mixer 147 and the receiver side mixer 111 also receive an input comprising a signal at an intermediate frequency, carrier frequency, or any other frequency from a reference signal source 127. The reference signal source 127 is discussed below in more detail. The reference signal aids in tuning of the communication device 100 to a desired frequency.

The frequency discriminator 114 processes the base band signal from the mixer 111 as would be understood by one of ordinary skill in the art and provides its output to an AFC filter 117 that filters the signal and provides the filtered signal to a summing junction 120. The output of the summing junction 120 generates a correction signal that is provided to the reference signal generator 127. The correction signal comprises a signal, based on the frequency of the received signal and the desired frequency, that is utilized to correct or compensate for error in the reference frequency generator 138.

The reference signal generator 127 is now discussed. In one embodiment, it comprises a reference frequency generator 138 configured to provide a signal at a reference frequency to a phase lock loop 135. The phase lock loop 135 operates in conjunction with a filter loop 129 and a voltage controlled oscillator 132 to generate a reference signal that is provided to the mixers 147, 111.

The operation of the system shown in FIG. 1 is now discussed. A measurement of the reference oscillator (REF) 138 frequency is made as follows. REF 138 is powered up so that it creates an oscillating signal. It is desired that the oscillating signal be at a particular frequency; however, due to the reasons discussed above, the signal may be at a different frequency. The purpose of the measurement is to determine how far this frequency is from the intended or desired frequency, or the amount of supplemental voltage that must be supplied to the voltage controlled oscillator to force the generated frequency to the desired frequency. Because the oscillating signal is the reference frequency for the one or more phase locked loops 135, it is of importance for system operation. REF 138 produces an oscillating signal known as the local oscillator signal, or LO signal.

The LO signal may be mixed with a base band signal that is derived from a base band ASIC 141. Alternatively, it may be mixed with an IF (intermediate frequency) signal (not shown). This produces an RF signal. Optionally, the LO signal may be mixed in more than one mixer (additional mixer not shown) with more than one base band signal (additional base band signal not shown) if used in a quadrature up-conversion transceiver. More specifically, as is well known in the art, the base band ASIC 141 may produce an I branch signal and a Q branch signal. These may each be mixed in their own mixers with the RF signal.

During transmission, the RF signal may be coupled into the transit (Tx) side of the duplexer 108. From there, the signal is coupled to an antenna 106. Optionally, the signal may be coupled to a test port (not shown), located between the duplexer and the antenna.

The test port may be used to couple the RF signal to a measurement device or the signal may be provided over the air from the antenna. In either configuration, the RF signal may be measured by the measurement device. In one embodiment the measurement device is a spectrum analyzer.

Generally, the initial calibration can be performed by measuring the reference frequency and accounting for that frequency during operation of the receiver. This includes measuring any frequency derived from the reference frequency, such as one or more LOs that may be used in the design. This may involve comparing the local oscillator signal to a known, external reference signal. The known reference signal may be a signal derived from an external signal generator such as a commercially available precision reference, or the reference frequency provided with standard test equipment, such as a calibration unit or the 10 MHz reference on a spectrum analyzer. The comparison may be performed in the handset or outside the handset.

If the comparison is done outside the handset, it may be convenient to measure the transmit RF signal which is derived from mixing the RF LO with an IF or base band signal. The RF signal is transmitted from the communication device over the air through the antenna or over a cable from a test point at the antenna. The transmitted RF signal is received by a test device with a known reference oscillator that generates a known reference frequency. In one embodiment transmitted RF signal is monitored in comparison to a signal having a known reference frequency. If there is a difference between the frequency of the transmitted RF signal and the reference frequency, then the voltage provided to the voltage controlled oscillator (VCO) in the communication device is varied until the difference between the frequency of the transmitted RF signal and the reference frequency becomes zero or close to zero. This amount of voltage variance, that is provided to the VCO, is recorded and may be stored in memory in the communication device as a correction factor that represents a voltage value or numeric value. During operation of the communication device at a later time the correction factor may be recalled from memory and provided to the VCO to thereby achieve generation of a signal at the desired frequency.

In another embodiment the frequencies of the known reference oscillator and the transmitted RF signal are compared. The comparison results in an offset value or error term that represents a frequency. This error term is stored in memory as a correction factor which can later be recalled and used to calibrate the reference oscillator to a precise frequency.

In one embodiment, the measurement can be made without any external reference besides the spectrum analyzer. The spectrum analyzer has its own reference source that produces a spectrum analyzer reference signal, which is an oscillating signal. The spectrum analyzer measures the frequency of the RF signal transmitted from the communication device. The frequency error or difference can then be removed by adjusting the control voltage of the VCO, such as in a closed loop feedback system. The adjustment made to the control voltage is stored as a correction factor, such as in a memory in the communication device. A commercially available spectrum analyzer may be used for this measurement, though more accurate external reference signals may also be used.

The correction factor that corrects for the frequency error is stored in memory 123. The correction factor is then used when the REF 138 is operated to ensure that reference frequency is at the correct, optimal frequency. In one embodiment the correction factor is a numeric value that is translated into a voltage which is in turn provided to the VCO to change the frequency of the signal output by the VCO.

In one embodiment, the correction factor is used when the transceiver attempts to acquire a signal such as a pilot signal from a base station. To acquire the pilot signal, the reference signal generator 127 should provide a signal to the mixers 111, 147 that is at a frequency very near the desired frequency. However the REF 138 may not oscillates near its intended frequency. The compensation from the correction factor is utilized to make REF 138 oscillate at its intended frequency. Advantageously, this allows for the use of less expensive, poorer quality reference oscillator in the transceiver or communication device. Transceivers with less expensive reference oscillators 138 and the correction factor capability will still consistently acquire a pilot signal, whereas transceivers with less expensive reference factors and no correction factor will not consistently acquire the pilot signal.

Figure 2:
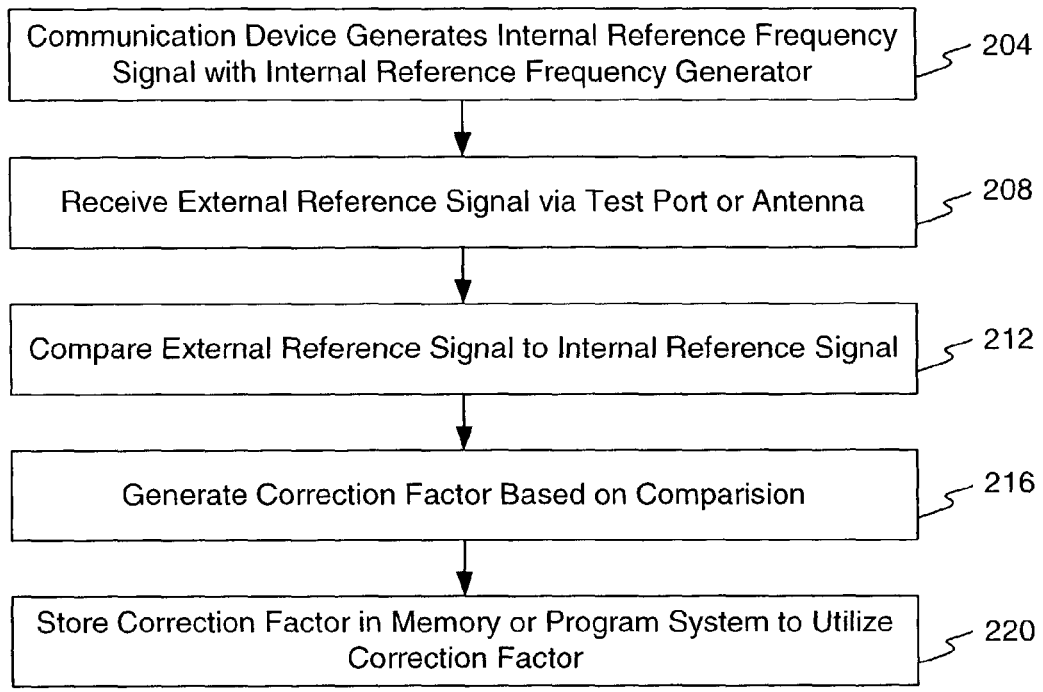
FIG. 2 illustrates an operational flow diagram of an example method for offset value generation.
Figure 3:
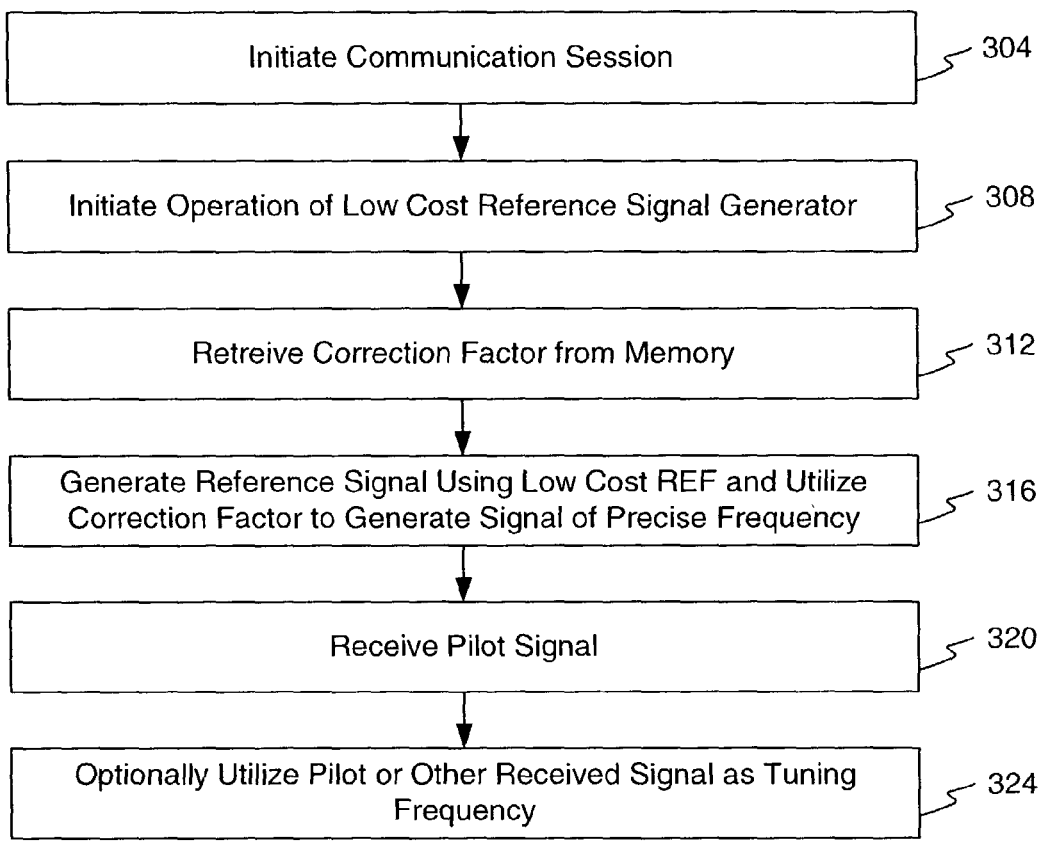
FIG. 3 illustrates an operational flow diagram of an example method for reference signal generation utilizing the offset value.

FIGS. 2 and 3 illustrate operational flow diagrams of exemplary methods of operation. These are exemplary methods of operation and it is contemplated that other methods of operation may be arrived at by one of ordinary skill in the art based on the teachings contained herein. It is contemplated that, based on the above-described procedure, the correction values or correction factors will be stored in memory at a time prior to execution of site methods described in FIG. 3.

Turning to FIG. 2, an exemplary method of correction factor generation is provided. At a step 204, the reference frequency generator or other device capable of generating a reference signal within the communication device generates an internal reference frequency signal. It is contemplated that, as an advantage to the method and apparatus disclosed herein, the reference frequency generator may be less expensive than prior art models that were highly accurate, albeit with less accuracy with regard to a desired reference frequency. At a step 208, the communication device receives an external or any other highly accurate reference signal that is at or may be made to be at the desired reference frequency. It may be received via a test port, via the antenna, or in any other manner known in the art. At a step 212, the operation compares the frequency of the external reference signal to the frequency of the internal reference signal.

The difference may be monitored and the VCO voltage of the communication device adjusted to determine a voltage offset that is required to force the difference to zero or other small value. In one embodiment the adjustment mechanism may comprise the error signal of closed loop feedback system, such as for example an output of a AFC filter. An offset value other than zero may comprise an indication that the frequency generated by the internal frequency generator is too high or too low. Next, at a step 216, the operation generates the correction factor. In one embodiment the correction factor is a numeric value that may be related to a voltage that is utilized to correct an existing error in frequency of the reference signal generator. In one embodiment, the correction factor equals the offset value. At a step 220, the correction factor is stored in the communication device, such as in memory, register, or any other storage location. As a result, the correction factor is available for use by the communication device at a later time.

It is contemplated that this operation may occur within the communication device or external to the communication device. Further, any manner of comparison or processing may be utilized to generate the correction factor.

FIG. 3 illustrates an operational flow diagram of an example method of utilizing the correction factor within a communication device. At a step 304, the communication device initiates a communication session. As is commonly understood, to acquire an incoming signal, the communication device must generate an accurate reference signal that is thereafter utilized to demodulate the desired signal. The reference signal is used to tune the various oscillators that are used in up and down conversion, and may also provide the reference for the system timing as used in ASICS where the digital demodulation occurs. That is, the reference signal is used to control the frequency of various oscillators in the design, as well as providing timing signals for any ASICS in the design. These devices, in turn, modulate and demodulate the incoming and outgoing signals.

The method and apparatus allows use of a less expensive reference signal generation system without a sacrifice in performance. Accordingly, at a step 308, the communication device initiates operation of the low cost reference signal generator. The signal generated by this device may not initially be as accurate as required or desired, and hence at a step 312, the system retrieves a correction factor from memory. The correction factor is thereby utilized in conjunction with the low cost reference signal generator to generate a highly accurate reference signal. As a result of the correction factor, the low cost reference signal generator outputs a highly accurate reference signal having a frequency at the desired frequency. This occurs at a step 316. As a result, a pilot or any other type of signal may be received at step 320. Thereafter at a step 324, it is contemplated that the pilot or other received signal may optionally be utilized to make the reference signal or the modulation/demodulation process more accurate. Alternatively, the reference signal generators and the correction factor may be continually utilized.

It is contemplated that the method described herein may be used with any type reference signal generator to improve performance. Moreover, as it is contemplated that even the highest quality and highest prices reference signal generators may drift in output frequency over time, this method may be utilized at any time to correct frequency drift in any type signal generator.

It will be understood that the foregoing embodiments are intended by way of example only. It is to be understood that there are many ways of implementing the invention. In addition, while various embodiments of the invention have been described, it will be apparent to those of ordinary skill in the art that many more embodiments and implementations are possible that are within the scope of this invention.

What is claimed is:

1. A method of calibrating a reference oscillator in a wireless device comprising:
   supplying power to the reference oscillator to thereby cause the reference oscillator to generate a radio frequency signal;
   producing a measuring device reference signal;
   comparing, using a measuring device external to the wireless device, the radio frequency signal to the measuring device reference signal;
   producing a correction factor from the comparison; and
   storing the correction factor in the wireless device.

2. The method of claim 1, further comprising coupling the correction factor to the reference oscillator to thereby adjust the frequency of the radio frequency signal.

3. The method of claim 1, wherein the radio frequency signal is mixed with a base band or an IF signal.

4. The method of claim 1, wherein the measuring device is a spectrum analyzer.

5. The method of claim 1, wherein the wireless device comprises a wireless telephone.

6. The method of claim 1, wherein the correction factor comprises a compensating value related to the frequency difference between the radio frequency and the reference frequency.

7. A method of generating an offset value for use within a wireless communication device comprising:
   generating an oscillator signal within a wireless communication device at an oscillator frequency, the oscillator frequency different than a desired reference frequency;
   outputting an output signal from the wireless communication device, the frequency of the output signal related to the oscillator frequency;
   generating an external reference signal with a signal generator;
   comparing, using test equipment external to the wireless communication device, the frequency of the output signal to the frequency of an external reference signal;
   responsive to the comparing, generating an offset value;
   providing the offset value to the wireless communication device; and
   storing the offset value in non-volatile memory of the wireless communication device.

8. The method of claim 7, wherein the test equipment is a spectrum analyzer, and the external reference signal is generated by the spectrum analyzer.

9. The method of claim 7, wherein outputting an output signal comprises outputting a signal at a multiple of the frequency of the oscillator signal.

10. The method of claim 7, wherein the offset value is related to the difference between the frequency of the oscillator signal and the frequency of the external reference signal.

11. The method of claim 7, wherein the offset value comprises a value that is utilized to compensate the oscillator frequency to thereby reduce the difference between the oscillator frequency and the desired reference frequency.

12. A method comprising:
   receiving, from a communication device, a signal having a frequency related to an oscillator frequency of a an oscillator within the communication device;
   comparing, externally to the communication device, the frequency to a reference frequency of a reference signal generated outside of the communication device;
   determining an offset value that when applied by the communication device reduces a difference between the frequency and the reference frequency;
   storing the offset value in the communication device.

13. The method of claim 12, wherein the comparing comprises:
   comparing the frequency to the reference frequency in an external testing device.

14. The method of claim 12, wherein the receiving comprises:
   receiving a radio frequency signal transmitted from the communication device.

15. The method of claim 12, wherein the receiving comprises:
   receiving the signal through a test port of the communication device.

* * * * *